US 6,576,950 B1

United States Patent
Cappelletti et al.

(10) Patent No.: US 6,576,950 B1
(45) Date of Patent: Jun. 10, 2003

(54) EEPROM TYPE NON-VOLATILE MEMORY CELL AND CORRESPONDING PRODUCTION METHOD

(75) Inventors: Paolo Cappelletti, Seveso (IT); Alfonso Maurelli, Sulbiate (IT); Nicola Zatelli, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/684,156

(22) Filed: Oct. 6, 2000

(30) Foreign Application Priority Data

Oct. 7, 1999 (EP) .............................. 99830628

(51) Int. Cl.[7] .......................................... H01L 29/788
(52) U.S. Cl. ...................................... 257/318; 257/321
(58) Field of Search .............................. 257/318, 317, 257/321, 315, 316; 438/262, 257, 264

(56) References Cited

U.S. PATENT DOCUMENTS

| 4,257,056 A | 3/1981 | Shum ........................... 357/23 |
| 5,504,706 A | 4/1996 | D'Arrigo et al. ......... 365/185.18 |
| 5,736,764 A | * 4/1998 | Chang ......................... 257/318 |
| 5,751,036 A | 5/1998 | Tanaka ........................ 257/315 |
| 5,814,866 A | 9/1998 | Borland ....................... 257/369 |
| 5,844,271 A | 12/1998 | Sethi et al. ................. 257/318 |
| 6,157,057 A | 12/2000 | Sheu et al. .................. 257/315 |
| 6,166,954 A | * 12/2000 | Chern .......................... 257/318 |
| 6,211,074 B1 | 4/2001 | Huang et al. ................ 438/655 |

FOREIGN PATENT DOCUMENTS

| EP | 0 272 732 A2 | 6/1988 |
| EP | 0 776 049 A1 | 5/1997 |
| EP | 0 820 103 A1 | 1/1998 |
| JP | 10223782 | 8/1998 |
| WO | WO 98/19343 | 5/1998 |
| WO | WO98/47150 | 10/1998 |

* cited by examiner

Primary Examiner—Tom Thomas
Assistant Examiner—Thien F Tran
(74) Attorney, Agent, or Firm—Lisa K. Jorgenson; Harold H. Bennett, II; Seed IP Law Group PLLC

(57) ABSTRACT

The memory cell is of the type with a single level of polysilicon, and comprises a sensing transistor and a select transistor. The sensing transistor comprises a control gate region with a second type of conductivity, formed in a first active region of a substrate of semiconductor material, and a floating gate region which extends transversely relative to the first active region. The control gate region of the sensing transistor is surrounded by a first well with the first type of conductivity, and in turn is surrounded, below and laterally, by a second well with the second type of conductivity, thus forming a triple-well structure. A second triple-well structure can be formed in a second active region adjacent to the first active region, and can accommodate conduction regions of the sensing transistor and of the select transistor.

12 Claims, 8 Drawing Sheets

US 6,576,950 B1

EEPROM TYPE NON-VOLATILE MEMORY CELL AND CORRESPONDING PRODUCTION METHOD

CROSS-REFERENCE TO RELATED APPLICATION

This application is related to U.S. patent application Ser. No. 09/684,721, filed Oct. 6, 2000, now pending, which application is incorporated herein by reference in its entirety.

TECHNICAL FIELD

The present invention relates to a non-volatile memory cell with a single level of polysilicon, in particular of the EEPROM type, and to a method for production of this cell.

BACKGROUND OF THE INVENTION

As is known, the semiconductors market is, with increasing urgency, requiring memory devices which are embedded in other electronic devices, for example advanced-logic devices such as microprocessors. In this type of application, it is necessary firstly to guarantee the functionality and reliability of the memory device, and secondly to keep unchanged as far as possible the performance of the advanced-logic device on the technological platform, and the macro-cell libraries on which the manufacturing methods of the incorporated devices are founded and based. These methods additionally require reduction as far as possible of the method steps which are in addition to those commonly used for production of the advanced-logic devices. In order to achieve this, it is therefore necessary to have memory cells which are highly compatible with the production methods for the said advanced-logic devices, with consequent lower production costs; the circuitry which makes the cells function must also be more efficient and simple.

At present, for this purpose, inter alia, memory cells with a single level of polysilicon are used.

In addition, when it is necessary for the memory cell to be erased per byte, EEPROM type cells are used.

FIGS. 1, 2 and 3 show in detail an EEPROM type memory cell 2 with a single level of polysilicon included in a memory device 1, comprising a substrate 3 of semiconductor material with a first type of conductivity, and in particular P.

The memory cell 2 comprises a sensing transistor 20 and a select transistor 21, which are disposed in series with one another. The sensing transistor 20 is formed in the substrate 3 at a first active region 30 and a second active region 31, which extend parallel to one another, and are isolated from one another by a field oxide portion 10a; field oxide portions 10b and 10c isolate the first and the second active regions 30, 31 from adjacent active regions, not shown. The select transistor 21 is formed in the substrate 3 at the second active region 31. In detail, the sensing transistor 20 comprises a diffuse control gate region 6, which has a second type of conductivity, and in particular N, formed in the first active region 30; memory source region 4 and memory drain region 5, of type N, formed in the second active region 31; a region of continuity 12, formed in the second active region 31, laterally relative to, and partially superimposed on, the memory drain region 5; and a polycrystalline silicon floating gate region 9, which extends above the substrate 3, transversely relative to the first and second active regions 30, 31.

The floating gate region 9 is formed from a rectangular portion 9a, which extends above the first active region 30, from a first elongate portion 9b and from a second elongate portion 9c; the two elongate portions 9b, 9c extend from the rectangular portion 9a above the field oxide portion 10a and the second active region 31. Above the second active region 31, the first elongate portion 9b is superimposed on a first channel region 40, which is delimited by the memory source region 4 and memory drain region 5; the second elongate portion 9c is superimposed on the continuity region 12.

The floating gate region 9 is isolated from the substrate 3 by means of a gate oxide region 7, with the exception of an area above the continuity region 12, and below the second elongate portion 9c, where a thinner, tunnel oxide region 8 is present.

In turn, the select transistor 21 comprises a selection source region 14, a selection drain region 15, and a gate region 19. The selection source region 14, which in this case is of type N, is formed in the second active region 31, on the side of the second elongate portion 9c of the floating gate region 9, opposite the memory drain region 5; the selection source region 14 is partially superimposed on the continuity region 12 of the sensing transistor 20. The selection drain region 15, of type N, is also formed in the second active region 31, and is spaced laterally from the selection source region 14, such as to delimit a second channel region 41. The polycrystalline silicon gate region 19 extends transversely relative to the second active region 31, above the second channel region 41, and is isolated from the substrate 3 by means of the gate oxide region 7.

FIGS. 4 to 9 show in succession some steps of the method for production of the memory cell 2.

In greater detail, starting from the substrate 3, after the field oxide portions 10a, 10b, 10c have been grown (FIG. 4), a layer of photo-sensitive material is deposited, in order to form a capacitor mask 50, which leaves bare the first active region 30 and the part of the second active region 31 in which the continuity region 12 is to be produced. Then, using the capacitor mask 50, there takes place in succession implantation and diffusion of a doping material, which is typically arsenic or phosphorous, such as to form the diffuse control gate region 6 and the continuity region 12 (FIGS. 5a, 5b). The capacitor mask 50 is then removed.

The gate oxide region 7 is then grown on the first and on the second active regions 30, 31 (FIGS. 6a, 6b). There is then deposited a layer of photo-sensitive material, in order to form a tunnel mask 51, which leaves the second active region 31 bare at the continuity region 12. After removal of the gate oxide region 7, in the part which is left bare (FIGS. 7a, 7b) the tunnel oxide region 8 is formed (FIGS. 8a, 8b).

A polycrystalline silicon layer is then deposited and removed selectively, in order to define simultaneously the floating gate region 9 of the sensing transistor 20 and the gate region 19 of the select transistor 21 (FIGS. 9a, 9b).

The method then continues with formation of the memory source region 4 and memory drain region 5 of the sensing transistor 20, and of the regions of selection source 14 and selection drain 15 of the select transistor 21 (FIGS. 1–3).

Although it is advantageous in various respects, the known memory cell has the disadvantages that it is not highly compatible with the new methods for production of the advanced-logic devices, in which the memory device 1 is incorporated, and it requires complex circuitry in order to function, and is thus costly to produce. In particular, during programming, it is necessary to generate and transfer a high voltage (for example of up to 9 V) to the continuity region 12, which involves considerable difficulties.

SUMMARY OF THE INVENTION

An embodiment of the invention is directed to a non-volatile memory cell with a single level of polysilicon. The memory cell includes a substrate of semiconductor material, a select transistor, and a sensing transistor. The substrate has a first type of conductivity and includes first and second active regions adjacent to each other. The select transistor is disposed in series relative to the sensing transistor and has selection conduction regions that are formed in the second active region. The sensing transistor includes a control gate region which has a second type of conductivity, formed in the first active region of the substrate, and a floating gate region. The floating gate region extends above the substrate, transversely relative to the first and second active regions. The control, gate region includes a triple-well structure. The triple-well structure includes a first isolating region, which has the second type of conductivity and is formed in the first active region; and a first isolated region, which has the first type of conductivity, and is enclosed below and laterally by first isolating region, the first isolated region surrounding the control gate region.

BRIEF DESCRIPTION OF THE DRAWINGS

The characteristics and advantages of the invention will become apparent from the following description of embodiments, provided by way of non-limiting example with reference to the attached drawings, in which.

DETAILED DESCRIPTION OF THE INVENTION

In the following description, the parts of the memory cells according to the illustrated embodiments of the invention which are common to the known memory cell, are provided with the same reference numbers, and reference should be made to the foregoing text, as far as the detailed description of these common parts is concerned.

Figure 10:
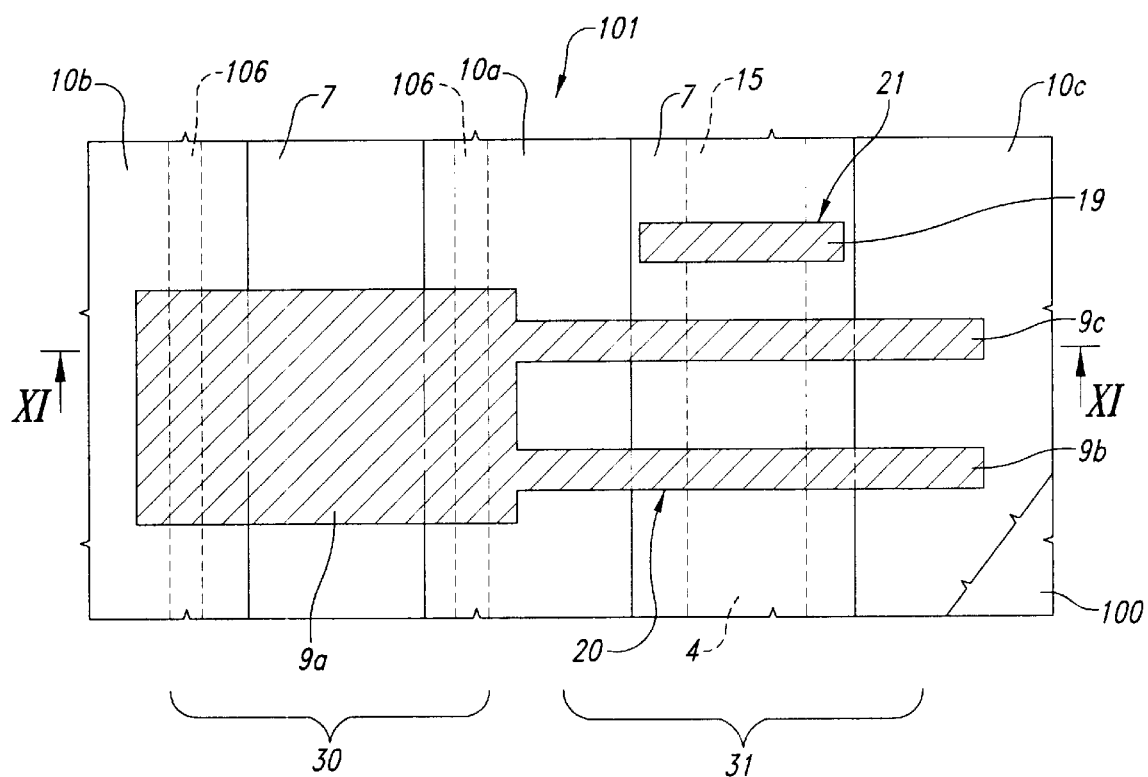
FIG. 10 is a plan view of a first embodiment of an EEPROM memory cell with a single level of polysilicon, according to the invention.
Figure 11:
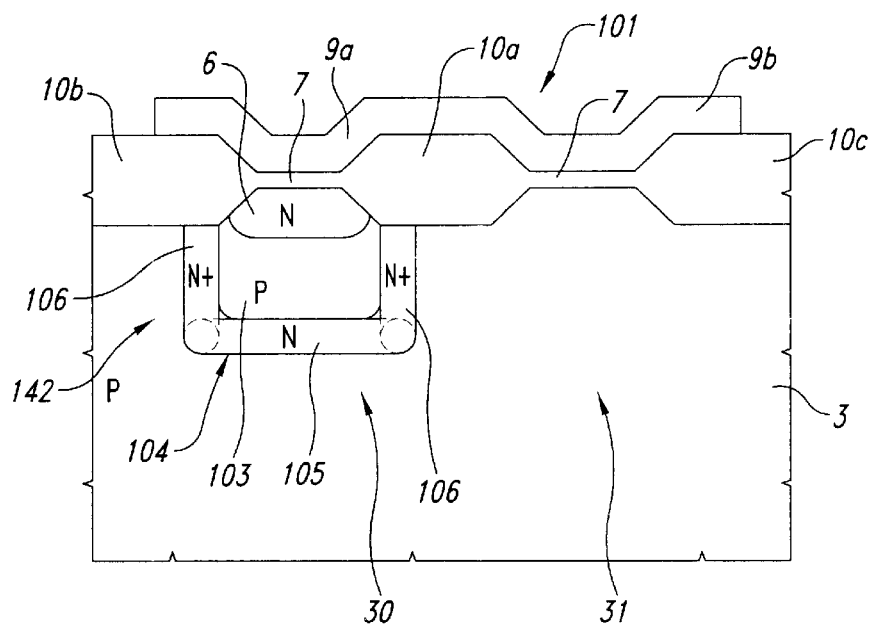
FIG. 11 is a transverse cross-section along line XI—XI in FIG. 10.

FIGS. 10 and 11 show in detail a first embodiment of an EEPROM type memory cell 101, with a single level of polysilicon, included in a memory device 100, which comprises the substrate 3.

Figure 1:
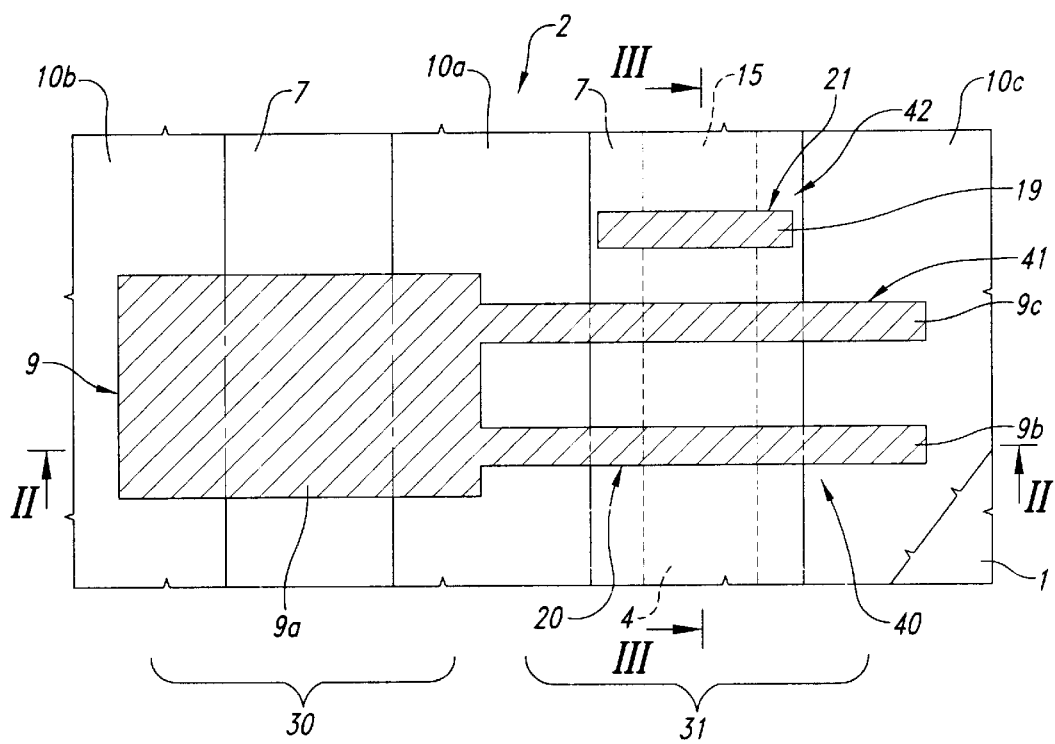
FIG. 1 is a plan view of a known type of EEPROM memory cell with a single level of polysilicon.
Figure 2:
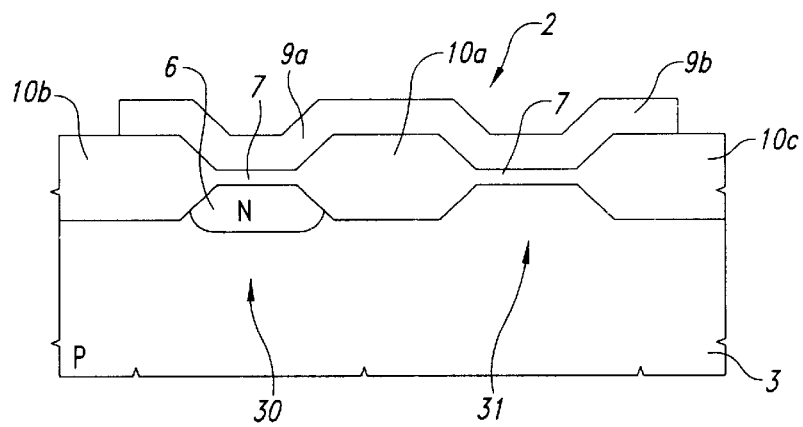
FIG. 2 is a transverse cross-section along line II—II in FIG. 1, of the known memory cell.
Figure 3:
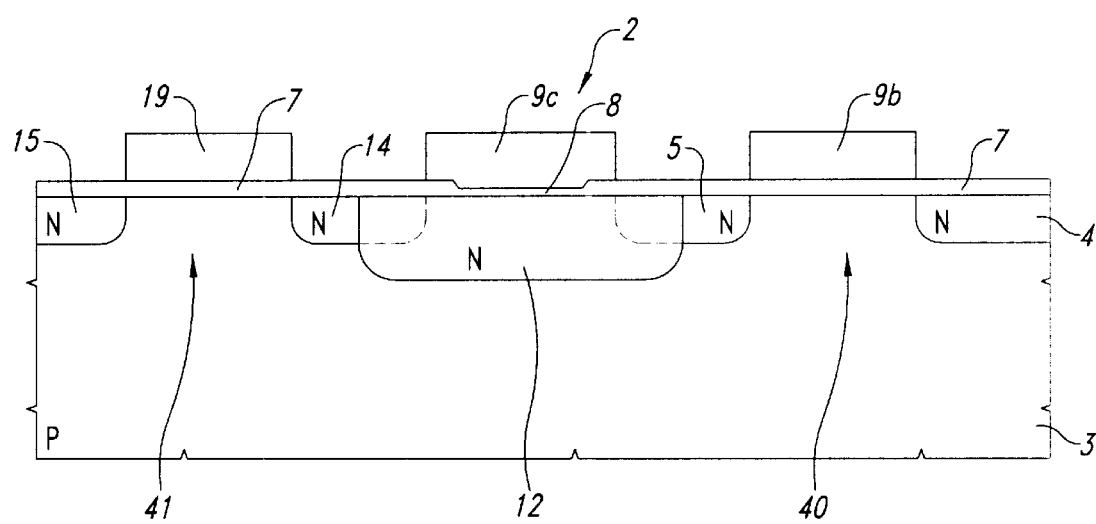
FIG. 3 is a transverse cross-section, along line III—III in FIG. 1, of the known memory cell.
Figure 4:
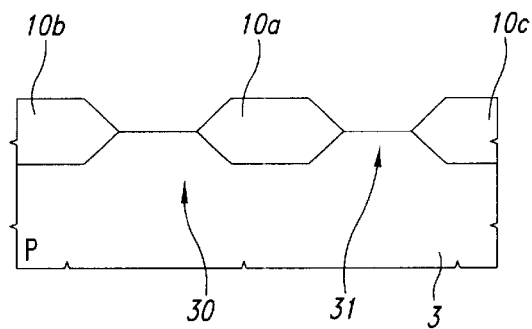
FIG. 4 is a transverse cross-section, similar to the cross-section shown in FIG. 2, of the known memory cell, in a first step of the production process.
Figure 5A:
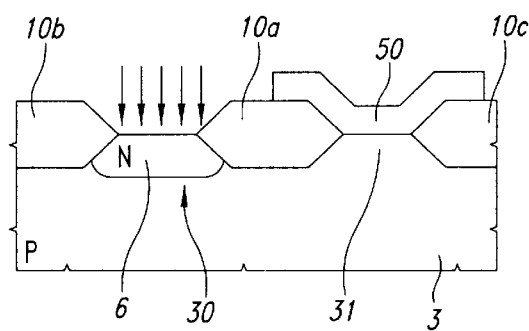
FIGS. 5a, 5b; 6a, 6b; 7a, 7b; 8a, 8b; and 9a, 9b are transverse cross-sections, respectively along lines II—II and III—III in FIG. 1, in successive steps of production of the known memory cell.
Figure 5B:
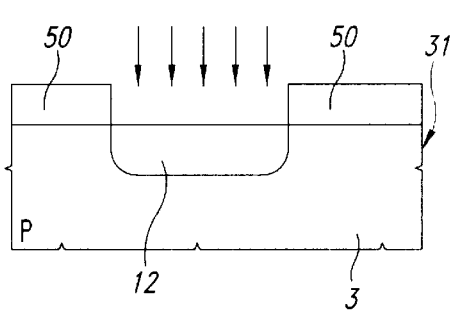
Figure 6A:
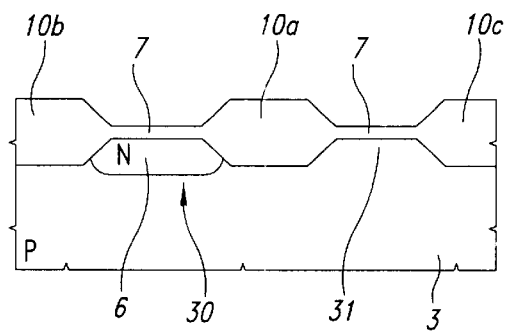
Figure 6B:
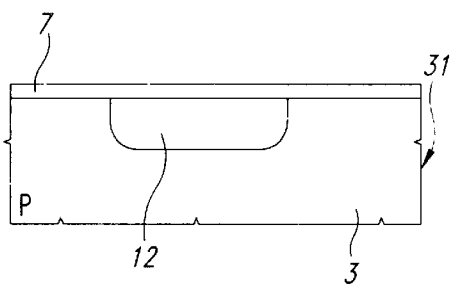
Figure 7A:
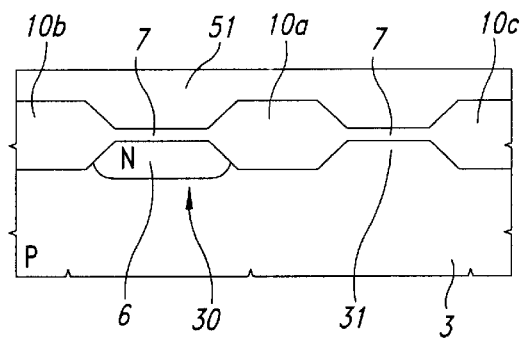
Figure 7B:
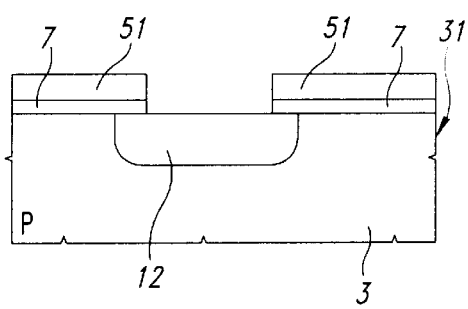
Figure 8A:
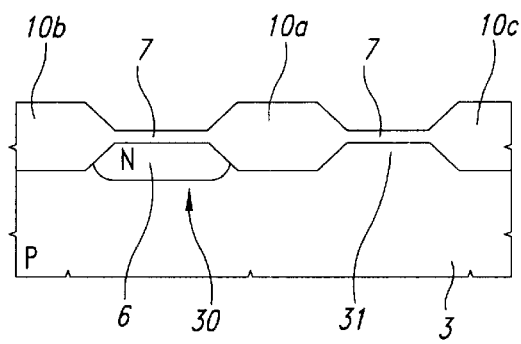
Figure 8B:
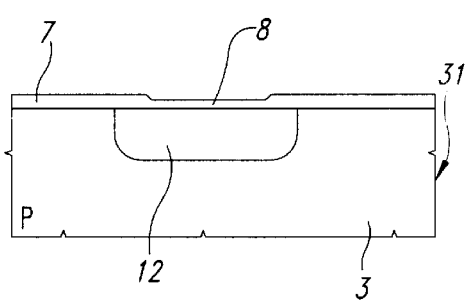
Figure 9A:
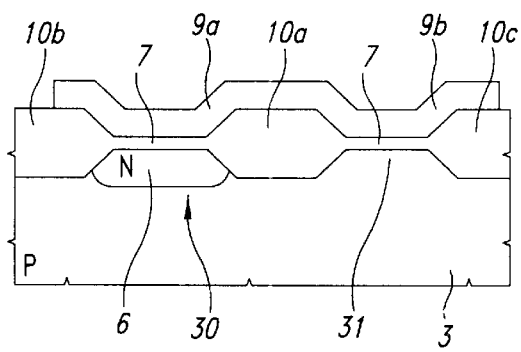
Figure 9B:
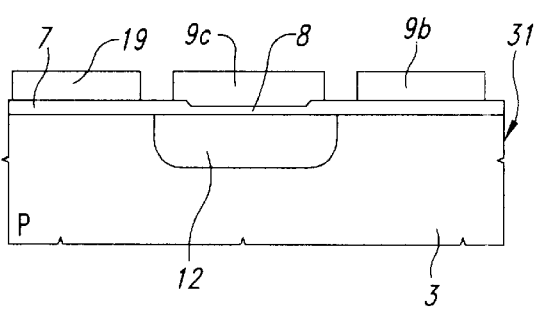

In greater detail, the memory cell 101 is similar to the known cell 1 in FIGS. 1–3, except for the fact that the diffused control gate region 6 is produced with a first triple-well structure 142.

In particular, the first triple-well structure 142 comprises a first well 103, which has the first type of conductivity, in this case P, which surrounds the diffuse control gate region 6, and is in turn contained in a second well 104, which has the second type of conductivity, in this case N. In greater detail, the second well 104 is formed from a first buried region 105, which is disposed below the first well 103, and from a first deep region 106, which has conductivity of type N+, and has an elongate annular shape, of which only two portions can be seen in the cross-section in FIG. 10. The first deep region 106 extends as far as the first buried region 105, such as to connect the latter to a surface 120 of the substrate 3, and to isolate the first well 103 completely from the remainder of the memory device 100.

Figure 12:
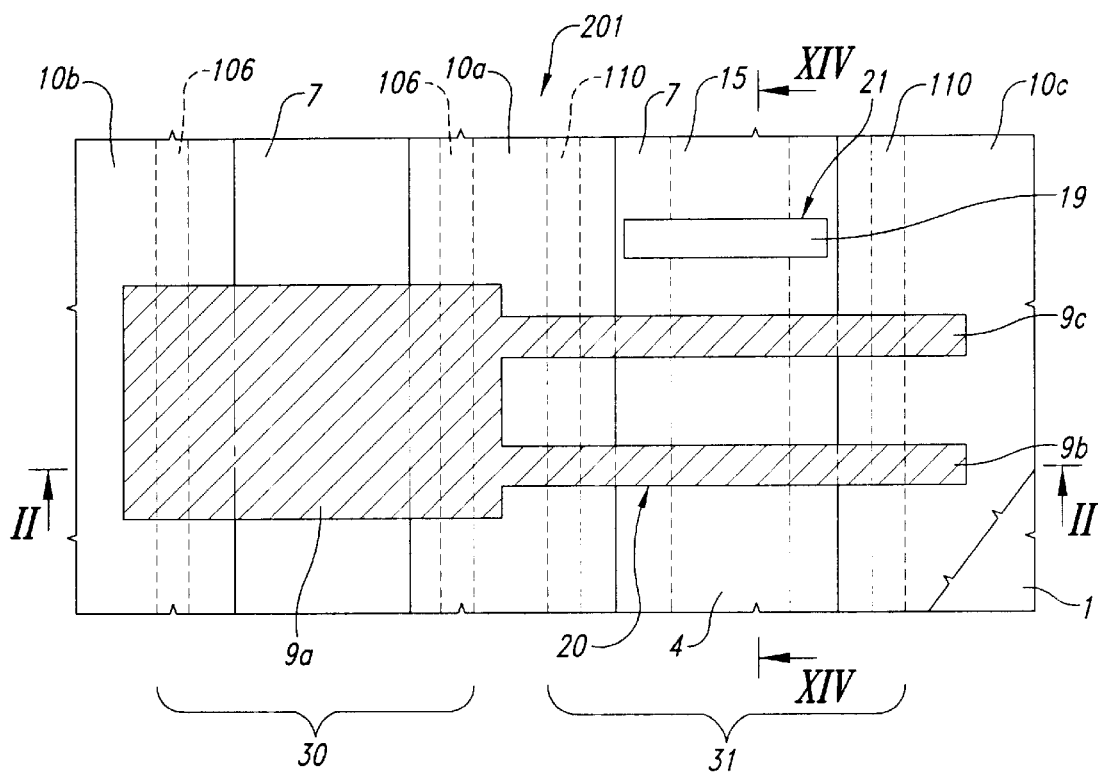
FIG. 12 is a plan view of a second embodiment of an EEPROM memory cell with a single level of polysilicon, according to the invention.
Figure 13:
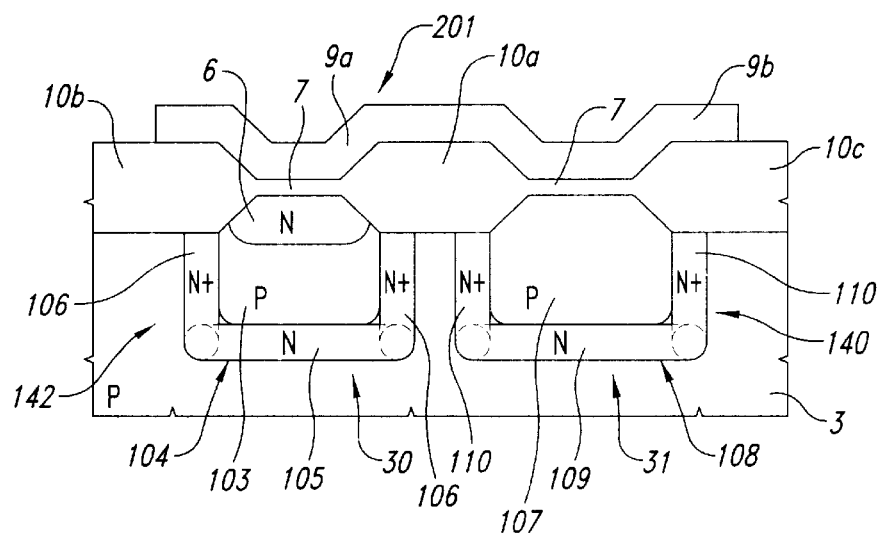
FIG. 13 is a transverse cross-section along line XIII—XIII in FIG. 12.
Figure 14:
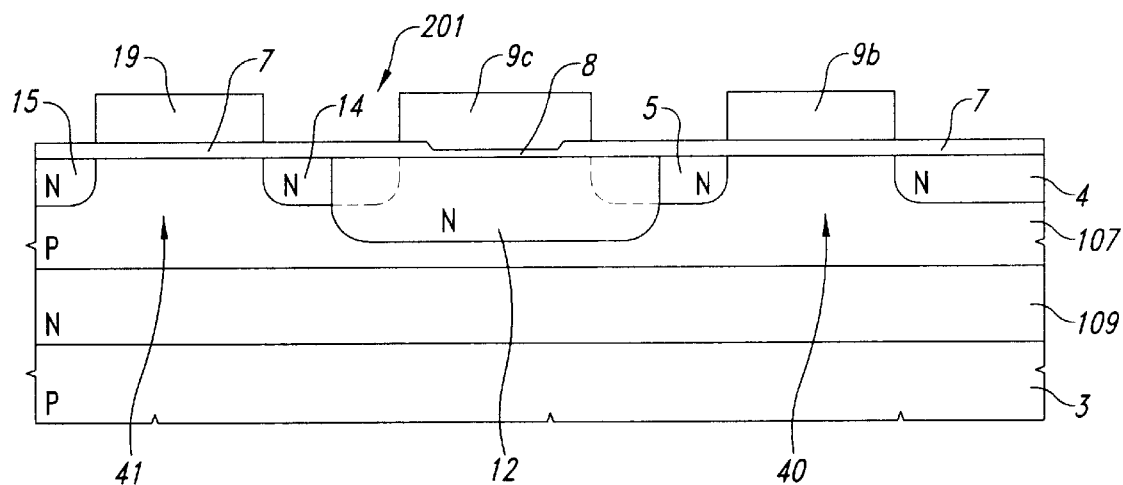
FIG. 14 is a transverse cross-section along line XIV—XIV in FIG. 12.
Figure 15:
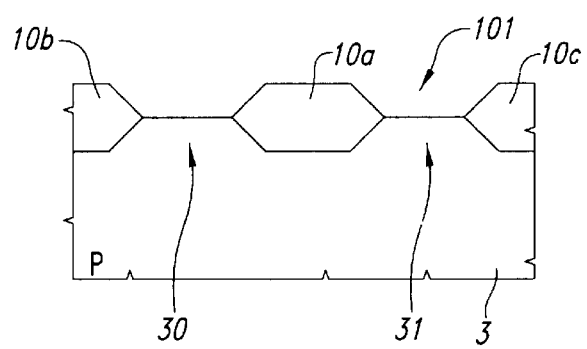
FIG. 15 is a transverse cross-section, similar to the cross-sections shown in FIGS. 11 and 13, for both embodiments of the memory cell according to the invention, in a first step of the production method.

FIGS. 12, 13 and 14 show in detail a second embodiment of a memory cell 201 according to the invention. In this case, the memory cell 201 is similar to the memory cell 101 in FIGS. 10, 11, except for the fact that a second triple-well structure 140 is also present, in the second active region 31.

In particular, the second triple well structure 140 comprises a third well 107, which has the first type of conductivity, in this case P, and accommodates the source and drain regions 4, 5, 14, 15, and the continuity region 12, and is in turn contained in a fourth well 108, which has the second type of conductivity, in this case N. In greater detail, the fourth well 108 consists of a second covered region 109, which is disposed below the third well 107, and of a second deep region 110, which has conductivity of type N+, and an elongate annular shape, of which only two portions can be seen in the cross-section in FIG. 10. The second deep region 110 extends as far as the second buried region 109, such as to connect the latter to the surface 120 of the substrate 3, and to isolate the third well 107 completely from the remainder of the memory device 100.

Figure 16:
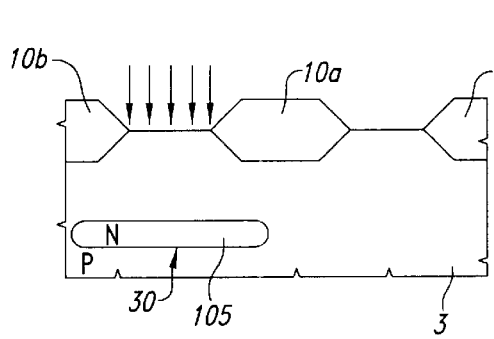
FIGS. 16–18 are transverse cross-sections, similar to the cross-section in FIG. 15, of the first embodiment of the memory cell according to the invention, in successive steps of the production method.
Figure 18:
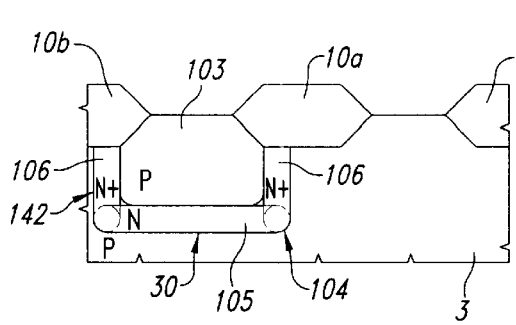

FIGS. 15 to 18 show in succession some steps of the method for production of the first embodiment of the memory cell 101. Starting from the substrate 3, after an initial step of definition of the first 30 and of the second 31 active regions, by means of growth of the field oxide portions 10a, 10b, 10c (FIG. 15), there follow the steps of:

high-energy implantation of a doping material, which in general is arsenic or phosphorous, at the first active region 30, in order to form, at depth, the first buried region 105 (FIG. 16);

implantation and subsequent diffusion of a doping material, which in general is arsenic or phosphorous, in the first active region 30, along the perimeter of the first buried region 105. By this means, there is formed the first deep region 106, which contacts the first buried region 105 in order to form the second well 104 (FIG. 17); and implantation and subsequent diffusion of a doping material, which in general is boron, inside the second well 104, in order to form the first well 103 (FIG. 18).

There then follow the standard steps for production of the other regions of the memory cell 101, as previously described, in particular with formation of the region of electrical continuity 12 in the second portion 41 of the second active region 31, and of the diffuse control gate region 6 in the first well 103; formation of the regions of gate oxide 7 and tunnel oxide 8; formation of the floating gate region 9 and gate regions 19 respectively of the sensing transistor 20 and the select transistor 21; and formation of the memory source region 4 and memory drain region 5 of the sensing transistor 20 and of the regions of selection source 14 and selection drain 15 of the select transistor 21 (FIGS. 10, 11).

Figure 19:
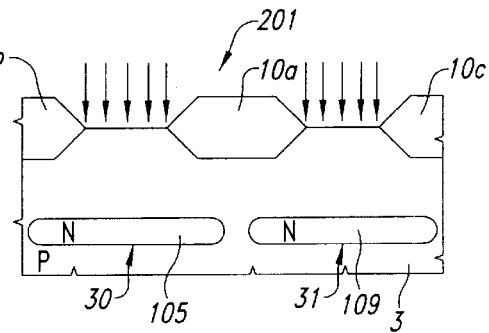
FIGS. 19–21 are transverse cross-sections, similar to the cross-section in FIG. 15, of the second embodiment of the memory cell according to the invention, in successive steps of the production method.
Figure 17:
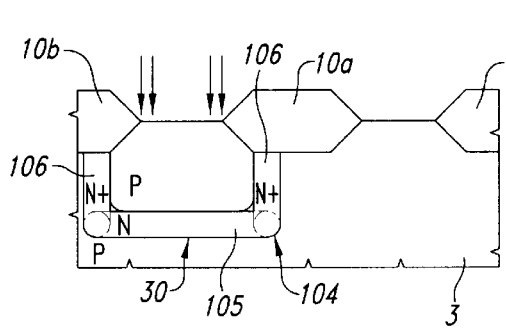
Figure 20:
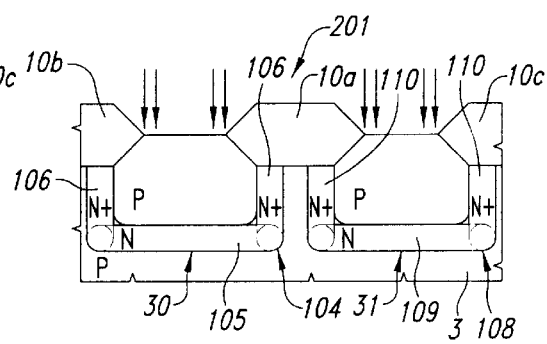
Figure 21:
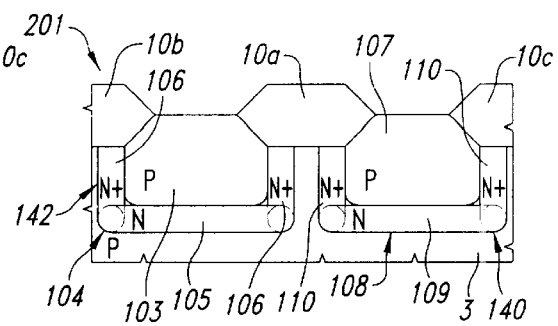

In the second embodiment of the memory cell 201, starting from the substrate 3, after definition of the first 30 and of the second 31 active regions, there follow the steps of:

high-energy implantation of a doping material, which in general is arsenic or phosphorous, at the first region and second active regions 30, 31, in order to form simultaneously, at depth, respectively the first buried region 105 and the second buried region 109 (FIG. 19);

implantation and subsequent diffusion of a doping material, which in general is arsenic or phosphorous, in the first and in the second active regions 30, 31, along the perimeters respectively of the first buried region and the second buried region 105, 109. By this means, there are formed simultaneously the first and the second deep regions 106, 110, which contact respectively the first and the second buried regions 105, 109, in order to form respectively the second well and the fourth well 104, 108 (FIG. 20); and implantation and subsequent diffusion of a doping material, which in general is boron, inside the second well and the fourth well 104, 108, in order to form respectively the first and the third wells 103, 107 (FIG. 21).

The method for production of the memory cell 101 201 then proceeds with steps which are the same as those previously described for the memory cell 101, with the particular feature that the source and drain regions 4, 5, 14, 15, and the continuity region 12, are now formed inside the third well 107 (FIGS. 12, 13, 14).

The advantages which can be obtained by means of the memory cell described are as follows. Firstly, the memory cell 101, 201 makes it possible to obtain greater simplicity at the level of the circuitry which is provided for operation of the cell. In fact, in both the embodiments of the memory cell 101, 201, the isolation of the diffuse control gate region 6 by means of the first triple-well structure 142 permits greater freedom of polarization of this region in comparison with the known solutions. In particular, it is possible to polarize negatively the diffuse control gate region 6, such as to reduce the voltages applied to the memory cell 101, 201 during the programming step, and thus to simplify the circuitry which is provided for the generation and control of these voltages, for the same electrical field necessary in this step, and thus for the same efficiency of the cell.

In greater detail, during the step of programming for "Fowler-Nordheim tunneling" of the memory cell 101, 201, it is possible to polarize negatively the diffuse control gate region 6 (for example to −4 V), by polarizing the continuity region 12 to a positive voltage which is lower than that previously necessary (for example 5 V instead of 9 V). By this means, programming of the memory cell 101, 201 is obtained in a manner similar to that which is known, but using lower voltages.

In the second embodiment of the memory cell 201, the isolation of the select transistor 21 by means of the second triple-well structure 140 makes it possible to polarize negatively the third well 107, and thus to simplify further the circuitry provided for functioning of the memory cell 201, as well as to increase the efficiency of the cell during reading.

In greater detail, during the step of erasure of the memory cell 201, by polarizing the third well 107 negatively (for example to −5 V), and by polarizing the diffuse control gate region 6 to a positive voltage which is lower than that previously necessary (for example 5 V instead of 10 V), erasure of the memory cell 201 is obtained in a manner similar to that known, but using lower voltages.

In addition, during the reading step, when a cell is to be read, by polarizing negatively (for example to −1 V) the third well 107 of the cells which are not addressed, and are connected to the same bit line as the cell to be read, it is possible to increase the body voltage of the select transistors 21 of the cells which are not addressed, thus increasing the threshold voltage, and reducing drastically the current leakages associated with the transistors, which should be switched off. Since these leakages converge on the bit line which is addressed, and are added to any current in the cell which is addressed and evaluated in order to determine whether the cell which is addressed has been written in or not, by reducing the current leakages the efficiency of reading of the memory device 100 is increased.

Use of the memory cell 101, 201 is very advantageous in applications in which the memory device 100 is of the low-density type (e.g., approximately 1 Kb), and is incorporated in an advanced-logic device, for example in a micro-processor. In fact, in the methods for production of new-generation advanced-logic devices, which use sub-micrometric technologies, for example of approximately 0.18 $\mu$m, the use of triple wells has already been introduced. Consequently, the method for production of the memory cell 101, 201 is highly compatible with these production methods for advanced-logic devices, thus further reducing additional production steps, and therefore the costs relating to production of the memory device 100, all without detracting from the high performance of the advanced-logic device.

Finally, it is apparent that many modifications and variants can be made to the memory cell and the production method described and illustrated here, all of which come within the scope of the inventive concept, as defined in the attached claims.

In particular, the memory cell can be either the two-level type (and store a single bit), or the multiple-level type (and store several bits).

We claim:

1. Non-volatile memory cell with a single level of polysilicon, comprising:

a substrate of semiconductor material, which has a first type of conductivity;

a sensing transistor, comprising a control gate region which has a second type of conductivity, formed in a first active region of the substrate, and a floating gate region:

a select transistor, which is disposed in series relative to the sensing transistor, and has selection conduction regions which are formed in the substrate, in a second active region which is adjacent to the first active region;

the floating gate region extending above the substrate, transversely relative to the first and second active regions;

wherein the control gate region includes a first triple-well structure; and wherein the select transistor includes a second triple-well structure.

2. The memory cell according to claim 1, wherein the first triple-well structure comprises:
   a first isolating region, which has the second type of conductivity, and is formed in the first active region; and
   a first isolated region, which has the first type of conductivity, and is enclosed below and laterally by first isolating region, the first isolated region surrounding the control gate region.

3. The memory cell according to claim 1, wherein second triple-well structure comprises:
   a second isolating region, which has the second type of conductivity, and is formed in the second active region;
   a second isolated region, which has the first type of conductivity, and is enclosed below and laterally by second isolating region, the second isolated region accommodating the selection conduction regions.

4. The memory cell according to claim 1, wherein the sensing transistor comprises: memory conduction regions, which are accommodated in the second active region, spaced from one another; a continuity region, which is accommodated in the second active region, between one of the memory conduction regions and one of the selection conduction regions, the memory and continuity conduction regions being provided in the second triple-well structure.

5. A non-volatile memory cell, comprising:
   a semiconductor substrate having a first conductivity type and including first and second active regions;
   a select transistor having first and second conduction regions formed in the substrate and a control gate; and
   a sensing transistor that includes a control gate region formed in the first active region, a floating gate region positioned above the second active region, and drain and source regions positioned in the second active region, wherein the control gate region of the sensing transistor is formed in a first isolated region defined on a lateral side by a first isolating region and defined on a bottom side by a first buried region and wherein the drain and source regions are formed in a second isolated region defined on a lateral side by a second isolating region and defined on a bottom side by a second buried region.

6. The memory cell of claim 5, wherein the floating gate region extends above the first and second active regions and is separated from the substrate by an oxide layer.

7. The memory cell of claim 5 wherein the first isolating region laterally surrounds the first isolated region.

8. The memory cell of claim 5 wherein the control gate region of the sensing transistor has a second conductivity type, the first isolated region has the first conductivity type, and the first isolating region and the first buried regions have the second conductivity type.

9. The memory cell of claim 5 wherein the first and second conduction regions of the select transistor are formed in the second active region and the control gate of the select transistor is formed above the second active region.

10. The memory cell of claim 9 further comprising a continuity region formed in the substrate and connecting the second conduction region of the select transistor with one of the drain and source regions of the sense transistor, the conduction regions of the select transistor, drain and source regions of the sense transistor, and the continuity region all having a second conductivity type opposite to the first conductivity type.

11. The memory cell of claim 5 wherein the first and second conduction regions of the select transistor are formed in the second isolated region and the control gate of the select transistor is formed above the second isolated region.

12. The memory of claim 11 wherein the floating gate has a length that extends over the first and second isolated regions and the first and second isolated regions have a length that is transverse to the length of the floating gate.

* * * * *